United States Patent
Adetutu et al.

(10) Patent No.: US 7,544,575 B2
(45) Date of Patent: Jun. 9, 2009

(54) DUAL METAL SILICIDE SCHEME USING A DUAL SPACER PROCESS

(75) Inventors: Olubunmi O. Adetutu, Austin, TX (US); Dharmesh Jawarani, Round Rock, TX (US); Randy W. Cotton, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 407 days.

(21) Appl. No.: 11/337,036

(22) Filed: Jan. 19, 2006

(65) Prior Publication Data

US 2007/0166937 A1 Jul. 19, 2007

(51) Int. Cl.
*H01L 21/336* (2006.01)

(52) U.S. Cl. .................. 438/299; 438/592; 438/664; 257/E21.438

(58) Field of Classification Search ................ 438/308
See application file for complete search history.

(56) References Cited

U.S. PATENT DOCUMENTS

| | | | | |
|---|---|---|---|---|
| 6,251,779 B1 * | 6/2001 | Lu et al. | ...... | 438/682 |
| 6,391,767 B1 | 5/2002 | Huster et al. | ...... | 438/630 |
| 6,528,402 B2 | 3/2003 | Tseng | ...... | 438/592 |
| 6,987,061 B2 * | 1/2006 | Mehrotra | ...... | 438/682 |
| 7,129,548 B2 * | 10/2006 | Chan et al. | ...... | 257/382 |
| 2002/0008295 A1 * | 1/2002 | Yang et al. | ...... | 257/413 |
| 2006/0121662 A1 * | 6/2006 | Fang et al. | ...... | 438/199 |

* cited by examiner

*Primary Examiner*—Stephen W Smoot
(74) *Attorney, Agent, or Firm*—Hamilton & Terrile, LLP; Michael Rocco Cannatti

(57) ABSTRACT

A semiconductor process and apparatus provide a polysilicon structure (10) and source/drain regions (12, 14) formed adjacent thereto in which a dual silicide scheme is used to form first silicide regions in the polysilicon, source and drain regions (30, 32, 34) using a first metal (e.g., cobalt). After forming sidewall spacers (40, 42), a second metal (e.g., nickel) is used to form second silicide regions in the polysilicon, source and drain regions (60, 62, 64) to reduce encroachment by the second silicide in the source/drain (62, 64) and to reduce resistance in the polysilicon structure caused by agglomeration and voiding from the first silicide (30).

20 Claims, 2 Drawing Sheets

DUAL METAL SILICIDE SCHEME USING A DUAL SPACER PROCESS

BACKGROUND OF THE INVENTION

1. Field of the Invention

The present invention is directed in general to the field of semiconductor devices. In one aspect, the present invention relates to the formation of silicided features in semiconductor devices.

2. Description of the Related Art

The use of silicides is well known in the field of semiconductor fabrication. A silicide is a silicon metal alloy. In MOS (metal oxide semiconductor) fabrication processes, silicides are used to provide low resistivity structures for contacting the gate electrode and the source and drain electrodes of a MOS transistor. Silicides preferably also serve as a barrier layer that prevents interaction between the semiconductor material of the source/drain areas and a subsequently formed interconnect.

Candidate metals for silicide formation that have received significant development effort include the Group VIII metal silicides, such as PtSi, $Pd_2Si$, $TiSi_2$, $CoSi_2$, $ErSi_2$, and NiSi, which exhibit desirably low resistivity, react with silicon at desirably low temperatures, and do not react with most dielectrics. Unfortunately, none of these materials is ideal for all applications in advanced MOS fabrication. For example, the use of nickel as a silicide metal for source/drain regions is problematic because NiSi exhibits $NiSi_2$ related spiking on p+ active regions, and encroachment under the spacer and gate electrode. Cobalt silicide is also problematic when formed in polysilicon gates because of dramatically increased resistance at lateral poly dimensions below 40 nm where agglomeration and voiding occur.

Accordingly, a need exists for a semiconductor manufacturing process which efficiently incorporates the benefits of multiple types of silicides without incurring disadvantages associated with any of the silicides. There is also a need for a fabrication process which avoids performance limitations associated with existing silicide materials at smaller device geometries. In addition, there is a need for extending the usefulness of existing silicide materials to smaller device geometries. There is also a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
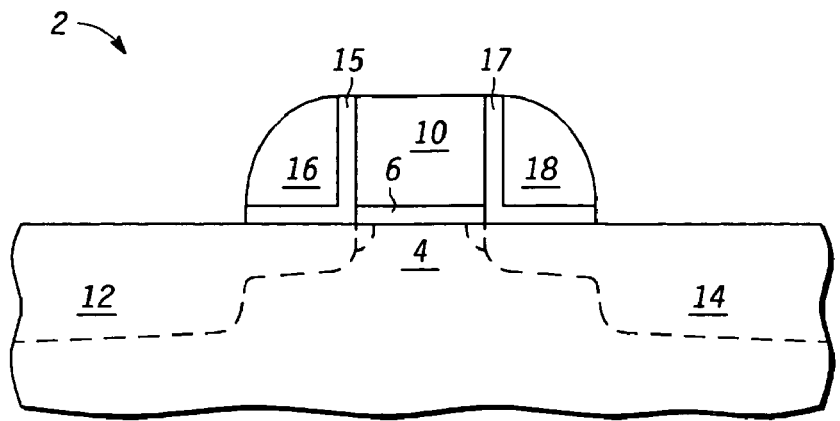
FIG. 1 is a partial cross sectional view of a semiconductor structure at an intermediate stage in the fabrication emphasizing the formation of a liner oxide and implant spacers in proximity to a conductive gate electrode.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating silicide regions using two silicide formation processes whereby a first silicide (e.g., cobalt silicide) is formed in the polysilicon and active source drain regions, and then sidewall spacers are formed and used in the formation of a second silicide (e.g., nickel silicide) in the polysilicon and active source drain regions. With this approach, the sidewall spacers effectively separate the nickel silicide in the active source/drain regions from channel region, thereby reducing encroachment. In addition, the second silicide fills any voids in the polysilicon that are left from the first silicide, which can occur with some silicides (e.g., $CoSi_2$) at certain polysilicon dimensions (e.g., below 40 nm). With the resulting structure, the polysilicon gates and lines are filled with a uniform silicide having low resistivity, while encroachment from the source/drain silicide regions is controlled and reduced.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art.

Turning now to FIG. 1, a partial cross sectional view is depicted of a semiconductor structure 2, including a substrate 4, a dielectric layer 6 and an etched polysilicon structure 10, such as a line or an etched gate stack which defines a channel region in the substrate 4. At the depicted intermediate fabrication stage, implant spacers are formed from liner oxide layers 15, 17 and dielectric layers 16, 18 in proximity to the polysilicon structure 10. In addition, source/drain regions 12, 14 (which may optionally include extension or halo regions) are depicted which may be formed before, during and/or after the formation of the polysilicon structure 10. As depicted, the source/drain regions 12, 14 may be formed by implanting halo regions and/or shallow extension regions around the etched polysilicon gate stack 10 using conventional implanting processes to implant ions having a predetermined conductivity type. In addition, the source/drain regions 12, 14 may also include deeper source/drain regions formed by implanting the ions around the implant spacers 15-18, again using conventional implanting processes. In keeping with conventional processes, the implanted ions are annealed or heated to drive or diffuse the implanted ions into the substrate 4 to form the source and drain regions 12, 14.

Depending on the type of device being fabricated, the substrate 4 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 4 may be implemented as the top silicon layer of a silicon-on-insulator (SOI) structure. Prior to forming the etched polysilicon structure 10, an insulator or dielectric layer 6 is formed by depositing or growing an insulator or high-k dielectric (e.g., silicon dioxide, oxynitride, metal-oxide, nitride, etc.) over the semiconductor substrate 4 using chemical vapor deposition (CVD), plasma-enhanced chemical vapor deposition (PECVD), physical vapor deposition (PVD), atomic layer deposition (ALD), thermal oxidation, or any combination(s) of the above. However formed, the insulator or dielectric layer 6 may be formed to a thickness of approximately 5 to 200 Angstroms when formed as the gate dielectric layer for a transistor, though other thicknesses may be used. As for the polysilicon structure 10, it may be formed by masking and etching one or more layers of (doped or undoped) polycrystalline silicon or silicon germanium which are deposited using CVD, PECVD, PVD, ALD, or any combination(s) thereof to a thickness of approximately 500-2000 Angstroms, though a thinner or thicker layer may also be used. Any desired patterning and etch sequence may be used to form the etched polysilicon structure 10, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and/or post-etch cleaning.

As will be appreciated, the polysilicon structure 10 may be used to form a gate stack or electrode in a PMOS or NMOS transistor device where the gate stack/electrode includes an upper polysilicon layer. However, the polysilicon structure 10 may also be used to form non-volatile memory devices, such as floating gate devices, nanocluster devices and SONOS (silicon-oxide-nitride-oxide-silicon) devices. With such applications, the polysilicon structure 10 is implemented with different types of materials or structures, such as a plurality of nanoclusters or nanocrystals (i.e., discrete storage elements), such as in the case of a nanocrystal NVM device, or some other material for conducting and storing charge. The polysilicon structure 10 may also include a nitride layer (not shown) which is subsequently used to provide a charge storage function in accordance with various non-volatile memory embodiments.

As depicted in FIG. 1, one or more dielectric layers 15, 17 (e.g., a liner oxide) and dielectric layers 16, 18 have been formed over the substrate 4 and polysilicon structure 10 and then selectively etched to form implant spacers 15-18 located adjacent to sidewalls of polysilicon structure 10. In the depicted implementation, liner oxide layers 15, 17 are formed as a thin layer (approximately 100 Å) of protective TEOS (tetraethylorthosilicate) oxide using any desired formation process (such as CVD, PECVD, PVD, ALD, thermal oxidation, or any combination(s) thereof), and then a relatively thick dielectric layer (e.g., over 500 Å of silicon nitride) is formed using any desired deposition process (such as CVD, PECVD, PVD, ALD, or any combination(s) thereof), and then the liner oxide layer and dielectric layer are selectively etched to form the implant spacers 15-18 adjacent to the polysilicon structure 10. Depending on the constituent materials and dimensions of the deposited dielectric layer(s), the etching may use one or more anisotropic etch processes to form implant spacers 15-18, including a dry etching process (such as reactive-ion etching, ion beam etching, plasma etching, laser etching), a wet etching process (wherein a chemical etchant is employed) or any combination thereof. As illustrated in the figures, the sidewall spacers (as well as any underlying spacer liner oxide) may be formed on two opposing sides of the etched polysilicon structure 10, but it will be appreciated that the sidewall spacers (as well as any underlying spacer liner oxide) may be formed on any one or more or all of the sides of the etched polysilicon structure 10. It will also be appreciated that a spacer or sidewall spacer may be formed from one or more dielectric layers on each side of an etched polysilicon or gate structure by forming physically separate spacers on each side or by forming a single spacer at one or more peripheral sidewalls of the etched polysilicon structure 10.

Figure 2:
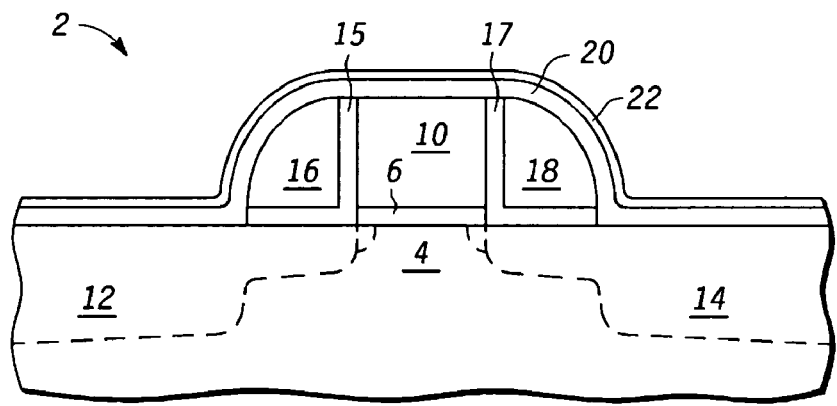
FIG. 2 illustrates processing subsequent to FIG. 1 after formation of one or more first metal layers over the semiconductor structure.

FIG. 2 illustrates processing of the semiconductor structure 2 subsequent to FIG. 1 after formation of one or more first metal layers 20, 22 over the semiconductor structure 2. In accordance with various embodiments, a first metal layer 20 is blanket deposited or sputtered on the semiconductor structure to a thickness of approximately 30-100 Angstroms, though a thinner or thicker layer may also be used. The first metal layer 20 contains the metal for the silicide to be formed on the polysilicon structure 10 and in at least a portion of the active source/drain regions 12, 14. The candidate metals for this first metal silicide include any of the group VIII metals. In an implementation desirable for its low resistivity, however, first metal layer 20 employs cobalt as the first silicide metal, though other conductive materials may also be formed or sputtered.

In a selected embodiment, the first metal layer is formed from two or more sublayers. For example, a first metal sublayer 22 is formed over the first metal layer 20 as a capping or barrier sublayer to a thickness (e.g., approximately 10-15 nm) that is suitable to form a barrier layer to prevent the introduction of oxygen atoms from the ambient during subsequent annealing step during silicide formation. Capping layer 22 also enables formation of a smoother silicide layer. A suitable barrier compound is titanium nitride, which is well known in the field of semiconductor processing for its barrier qualities.

Figure 3:
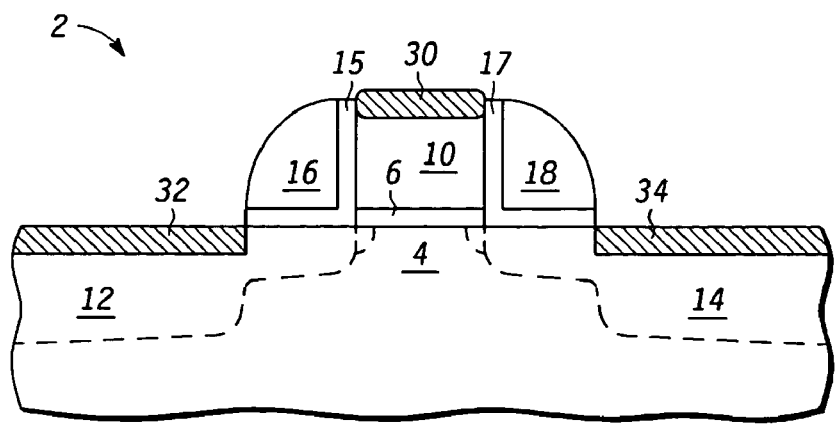
FIG. 3 illustrates processing subsequent to FIG. 2 after formation of first silicide regions in the gate, source and drain regions.

FIG. 3 illustrates processing of the semiconductor structure 2 subsequent to FIG. 2 after formation of first silicide regions 30, 32, 34 in the gate, source and drain regions. In an illustrative embodiment, the reaction of the first metal layer 20 and the underlying semiconductor material is promoted by performing an initial rapid thermal anneal step, followed by a wet clean step to remove the unreacted metal from the dielectric areas (e.g., spacers and trench regions), and then followed by an optional second anneal step. The anneal can be rapid thermal processing, furnace anneal, spike anneal or laser anneal, for example. In a selected embodiment, a rapid thermal anneal (RTA) process subjects the semiconductor structure 2 to an inert ambient heated to a temperature of less than 600° C. (e.g., 450° C.) for a duration of less than 60 seconds to react the cobalt or other metal in first metal layer 20 with the underlying polysilicon or other semiconductor material in source/drain regions 12, 14. The timing and temperature of the initial rapid thermal anneal step are selected so that the metal layer 20 reacts with the exposed surfaces of the polysilicon structure 10 and substrate 4, but not with the implant spacer material 15-18. After the first anneal is performed, any unreacted portion of the first metal layer 20 (including any capping sublayer 22) is selectively removed with an appropriate metal etch, such as a Piranha wet clean process. In the embodiment depicted in FIG. 3, the unreacted portions of first metal layer 20 include all portions overlying any dielectric—such as any implant spacers 15-18 and isolation dielectric (not shown)—thereby leaving the exposed polysilicon structure 10 and source/drain regions 12, 14 as the only areas in which the metal will react. After removing the unreacted first metal layer 20, the remaining first metal layer is heated in the second optional anneal step in an inert ambient to a temperature of greater than 600° C. (e.g., 700° C.) for less than 60 seconds to react with the underlying silicon and complete the formation of the first silicide regions 30, 32, 34 on the exposed surfaces of the polysilicon 10 and substrate 4, thereby forming $CoSi_2$, for example The timing and temperature of the second anneal step may be selected so that the reacted silicide 30, 32, 34 is pushed into a low resistivity phase, taking into account the subsequent thermal treatment of the semiconductor structure 2.

Figure 4:
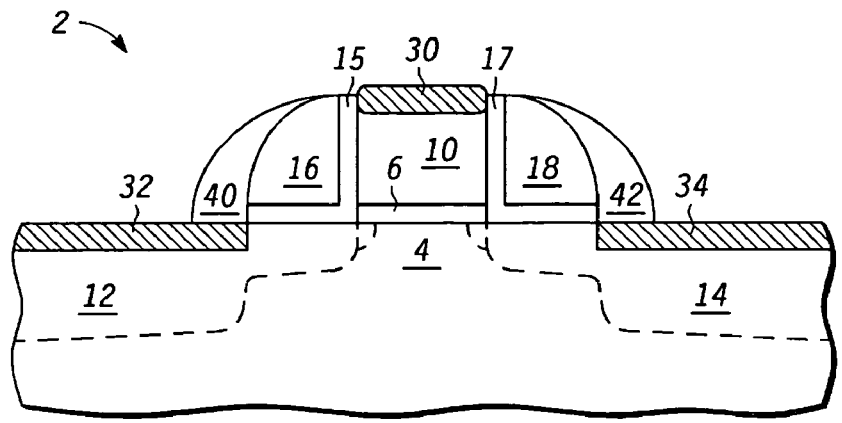
FIG. 4 illustrates processing subsequent to FIG. 3 after formation of sidewall spacers.

FIG. 4 illustrates processing of the semiconductor structure 2 subsequent to FIG. 3 after formation of sidewall spacers 40, 42. As will be appreciated, the spacers 40, 42 may be formed as a single continuous spacer that is formed on the lateral sidewalls of the etched polysilicon structure 10, though the spacers may also be formed as separate spacer structures or may be referred to separately even though formed as part of a single continuous spacer structure. As illustrated, the spacers 40, 42 may be formed by depositing any desired dielectric material (such as oxide or nitride) and then selectively etching the deposited material using one or more anisotropic etch processes to form sidewall spacers 40, 42. Thus, the spacers 40, 42 are formed adjacent to and/or on the implant spacers 15-18. Suitable spacer etch processes include dry etching, wet etching process or any combination thereof. Because the sidewall spacers 40, 42 are used in the formation of the second silicide regions (described below), the sidewall spacers 40, 42 may also be referred to as silicide spacers. In selected embodiments, the final remaining thickness of the sidewall spacers 40, 42 may be selected to ensure that any encroachment by the second silicide regions does not proceed into any gate channel region and/or past the existing halo or extension regions.

Figure 5:
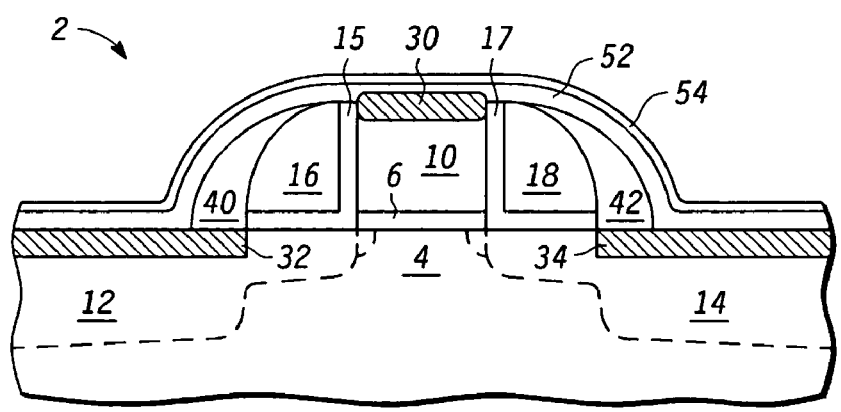
FIG. 5 illustrates processing subsequent to FIG. 4 after formation of one or more second metal layers over the semiconductor structure.

FIG. 5 illustrates processing of the semiconductor structure 2 subsequent to FIG. 4 after formation of one or more second metal layers 52, 54 over the semiconductor structure 2. In accordance with various embodiments, a second metal layer 52 is blanket deposited or sputtered on the semiconductor structure (e.g., during wafer processing) to a thickness of approximately 30-200 Angstroms, though a thinner or thicker layer may also be used. The second metal layer 52 contains a metal material that may be selected from any of the group VIII metals. In a selected embodiment, the second metal layer 52 is a metal that is different from the metal in first metal layer 20 so that a silicide formed from second metal layer 52 is different than the silicide of first silicide structures 32, 34. In an implementation designed to avoid problems associated with using cobalt to form a silicide on fine polysilicon lines and that provides low resistivity in the polysilicon structure 10, the second metal layer 52 employs nickel as the second silicide metal, though other conductive materials may also be formed or sputtered. Although nickel and its silicide are associated with spiked junctions and encroachment when used on source/drain regions, nickel exhibits desirable characteristics such as low resistivity when used on polysilicon gate electrodes and/or lines. Moreover, nickel does not exhibit the same difficulties that cobalt exhibits when used to form silicides over narrow polysilicon lines.

In a selected embodiment, the second metal layer 52 is formed from two or more sublayers. For example, a second metal sublayer 54 is formed over the second metal layer 52 as a capping or barrier sublayer to a thickness that is suitable to form a barrier layer to prevent the introduction of oxygen atoms from the ambient during subsequent annealing step during silicide formation. Second metal sublayer 54 is a barrier layer that includes a barrier material such as the titanium nitride described above with respect to capping sublayer 22 of FIG. 2.

Figure 6:
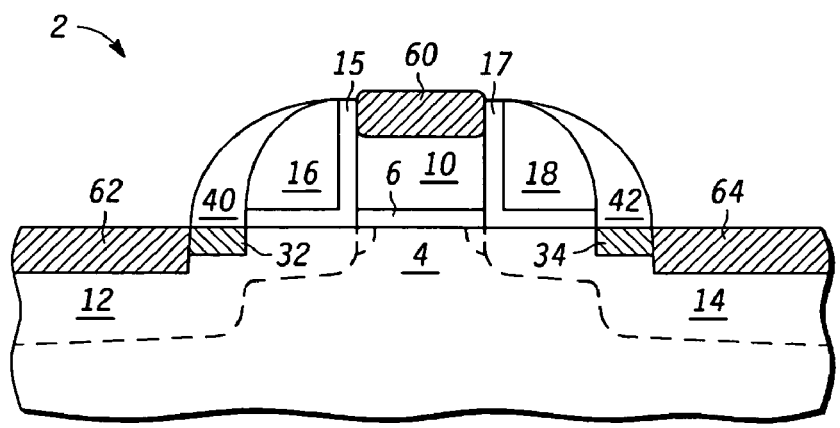
FIG. 6 illustrates processing subsequent to FIG. 5 after formation of second silicide regions in the gate, source and drain regions.

FIG. 6 illustrates processing of the semiconductor structure 2 subsequent to FIG. 5 after formation of second silicide regions 60, 62, 64 in the gate, source and drain regions. In an illustrative embodiment, the reaction of the second metal layer 52 and the underlying semiconductor material is promoted by performing an anneal step, followed by a wet clean step to remove the metal from the exposed surfaces of the implant spacer material 15-18, sidewall spacers 40, 42 and isolation regions (not shown), and then followed by an optional second anneal step. For example, a rapid thermal anneal (RTA) process subjects the semiconductor structure 2 to an inert ambient heated to a temperature of less than 500° C. (e.g., 360° C.) for less than 60 seconds to react the nickel or other metal in second metal layer 52 with the underlying polysilicon or other semiconductor material in source/drain regions 12, 14. The timing and temperature of the initial rapid thermal anneal step are selected so that the metal layer 52 reacts with the exposed surfaces of the polysilicon structure 10 and substrate 4, but not with the material of the implant spacers 15-18, sidewall spacers 40, 42 and isolation regions (not shown). After the first anneal is performed, any unreacted portion of the second metal layer 52 (including any capping sublayer 54) is removed with an appropriate wet etch, such as a Piranha clean process. In the embodiment depicted in FIG. 6, the unreacted portions of second metal layer 52 include all portions overlying any dielectric—such as any implant spacers 15-18, sidewall spacers 40, 42 and isolation dielectric (not shown)—thereby leaving the exposed polysilicon structure 10 and source/drain regions 12, 14 as the only areas in which the metal will react. After removing the unreacted second metal layer 52, the remaining second metal layer is heated in the optional second anneal step in an inert ambient to a temperature at or below 500° C. (e.g., 400° C.) for less than 30 seconds to react with the underlying silicon and form second silicide regions 60, 62, 64 on the exposed surfaces of the polysilicon 10 and substrate 4. The timing and temperature of the second rapid thermal anneal step may be selected so that the reacted silicide 60, 62, 64 is pushed into a low resistivity phase, taking into account the subsequent thermal treatment of the semiconductor structure 2. The second set of spacers 40, 42 may not be removed by wet or dry etch after forming the second silicide 60, 62, 64.

In one form, there is provided herein a method for fabricating a semiconductor structure by forming a first insulating layer over a semiconductor substrate and then forming a narrow (e.g., having a line width of less than 40 nm) etched gate stack on the first insulating layer having an upper polysilicon layer. Next, first implant spacers are formed on each side of the etched gate stack, such as by forming a spacer liner oxide on at least side surfaces of the etched gate stack and then forming nitride sidewall spacers adjacent to the spacer liner oxide on each sidewall of the etched gate stack. With the first implant spacers in place, source/drain regions are formed in the semiconductor substrate adjacent to the etched gate stack and first implant spacers. With this structure, a first silicide (e.g., cobalt silicide) is formed on any exposed surface of the polysilicon layer and source/drain regions. Next, second sidewall spacers are formed on each side of the first implant spacers and a second, different silicide (e.g., nickel silicide) is formed on any exposed surface of the polysilicon layer and on any exposed surface of the source/drain regions not covered by the first and second sidewall spacers or isolation regions. Either silicide may be formed by depositing a metal layer over the semiconductor structure, performing a rapid thermal anneal to react the metal with the polysilicon layer and at least part of the source/drain regions, removing unreacted portions of the metal layer and then performing a second rapid thermal anneal. With this approach, the second silicide may be used to fill any voids in the polysilicon layer that are left from the first silicide, and the second sidewall spacer is spaced to reduce encroachment by the second silicide. In addition, the second sidewall spacers may optionally be removed after the second silicide is formed.

In another form, a method is provided for forming dual metal silicide regions in a transistor structure which includes a polysilicon gate and gate dielectric layer formed over a substrate. Under the method, first silicide regions are formed from a first metal (e.g., cobalt) in the polysilicon gate and in active source/drain regions in the substrate that are adjacent to the polysilicon gate. In an example implementation, the first silicide regions are formed by forming an etched first polysilicon gate over a gate dielectric and substrate, forming first spacers on each side of the etched first polysilicon gate, forming active source/drain regions adjacent to the etched first polysilicon gate and first spacers, and then forming a first silicide region on any exposed surface of the etched first polysilicon gate and the active source/drain regions. Next, second spacers are formed over the semiconductor substrate on each side of the polysilicon gate. In an example implementation, the second spacers are formed by forming a spacer liner oxide on at least side surfaces of the etched first polysilicon gate, and then forming nitride sidewall spacers adjacent to the spacer liner oxide on each sidewall of the etched first polysilicon gate. Finally, second silicide regions are formed from a second metal (e.g., nickel) in the polysilicon gate and in any exposed surface of the active source/drain regions not covered by the second spacers. In a selected embodiment, the silicide regions are formed by depositing a metal layer, annealing the metal layer (e.g., with a rapid thermal anneal, a furnace anneal, a spike anneal or a laser anneal) to react with the first polysilicon gate and at least part of the active source/drain regions, removing unreacted portions of the metal layer, and annealing any remaining reacted metal layer.

In yet another form, there is provided a method for fabricating silicide regions using two silicide formation processes. After first silicide regions (e.g., cobalt silicide) are formed in a polysilicon gate and active source/drain regions, sidewall spacers are formed adjacent the polysilicon gate to partially cover the active source/drain regions, and then second silicide regions (e.g., nickel silicide) are formed in the polysilicon gate and any exposed surface of the active source/drain regions not covered by the sidewall spacers by using the sidewall spacers to effectively separate the nickel silicide in the active source/drain regions from a channel region below the polysilicon gate, thereby reducing encroachment of the nickel silicide regions.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted transistor structures may also be formed in a well region (not shown) of the substrate which may be an n-doped well or a p-doped well. Also, the various silicon-based constituent layers may be formed with different conductive materials than those disclosed. In addition, the source and drains and extensions may be p-type or n-type, depending on the polarity of the underlying substrate or well region, in order to form either p-type or n-type semiconductor devices. Moreover, the thickness of the described layers may deviate from the disclosed thickness values, and any specified etch chemistries are provided for illustration purposes only. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor structure, comprising:

providing a semiconductor substrate;

forming a first insulating layer over the semiconductor substrate;

forming an etched gate stack over the first insulating layer comprising an upper polysilicon layer;

forming first spacers over the semiconductor substrate on each side of the etched gate stack;

forming source/drain regions in the semiconductor substrate adjacent to the etched gate stack and first spacers;

forming a first silicide on any exposed surface of the polysilicon layer and source/drain regions not covered by the first spacers;

forming second spacers over the semiconductor substrate on each side of the first spacers and over part of the first silicide; and forming a second silicide on any exposed surface of the polysilicon layer and on any exposed surface of the source/drain regions not covered by the first and second spacers, where the first silicide and the second silicide are different.

2. The method of claim 1, wherein forming an etched gate stack comprises forming a gate electrode having a line width of less than 40 nm.

3. The method of claim 1, where the first silicide is cobalt silicide.

4. The method of claim 1, where the second silicide is nickel silicide.

5. The method of claim 1, wherein the first silicide is cobalt silicide and the second silicide is nickel silicide.

6. The method of claim 1, where forming first spacers comprises:
   forming a spacer liner oxide over the semiconductor substrate on at least side surfaces of the etched gate stack; and
   forming nitride sidewall spacers adjacent to the spacer liner oxide on each sidewall of the etched gate stack.

7. The method of claim 1, wherein forming the first silicide comprises:
   depositing a first metal layer over the semiconductor structure;
   performing a first rapid thermal anneal to react the first metal layer with the polysilicon layer and at least part of the source/drain regions;
   removing unreacted portions of the first metal layer; and
   performing a second rapid thermal anneal.

8. The method of claim 1, wherein forming the second silicide comprises:
   depositing a second metal layer over the semiconductor structure;
   performing a first rapid thermal anneal to react the second metal layer with the polysilicon layer and at least part of the source/drain regions;
   removing unreacted portions of the second metal layer; and
   performing a second rapid thermal anneal, whereby the second silicide does not encroach under the etched gate stack.

9. The method of claim 1, where the second silicide fills any voids in the polysilicon layer that are left from the first silicide.

10. The method of claim 1, where the second spacers are spaced to reduce encroachment by the second silicide.

11. The method of claim 1, where the second spacers are removed after forming the second silicide.

12. A method for forming dual metal silicide regions in a transistor structure having a first polysilicon gate and gate dielectric layer formed over a substrate to define active source/drain regions, comprising:
   forming first silicide regions from a first metal in a first polysilicon gate and in active source/drain regions in the substrate and adjacent to the first polysilicon gate;
   forming spacers over the substrate on each side of the first polysilicon gate and over part of the first silicide regions; and
   forming second silicide regions from a second metal in the first polysilicon gate and in any exposed surface of the active source/drain regions not covered by the spacers, where the first and second metals are different.

13. The method of claim 12, where forming first silicide regions comprises:
   providing a substrate;
   forming a gate dielectric layer over the substrate;
   forming an etched first polysilicon gate over the gate dielectric layer comprising an upper polysilicon layer;
   forming first spacers over the substrate on each side of the etched first polysilicon gate;
   forming active source/drain regions in the substrate adjacent to the etched first polysilicon gate and first spacers; and
   forming a first silicide on any exposed surface of the upper polysilicon layer and the active source/drain regions.

14. The method of claim 12, where the first metal is cobalt and the second metal is nickel.

15. The method of claim 12, where forming spacers comprises:
   forming a spacer liner oxide over the substrate on at least side surfaces of an etched first polysilicon gate; and
   forming nitride sidewall spacers adjacent to the spacer liner oxide on each sidewall of the etched first polysilicon gate.

16. The method of claim 12, wherein forming first silicide regions comprises:
   depositing a first metal layer;
   annealing the first metal layer to react with the first polysilicon gate and at least part of the active source/drain regions;
   removing unreacted portions of the first metal layer; and
   annealing any remaining reacted first metal layer to form the first silicide regions.

17. The method of claim 12, wherein forming second silicide regions comprises:
   depositing a second metal layer;
   annealing the second metal layer to react with the first polysilicon gate and at least part of the source/drain regions;
   removing unreacted portions of the second metal layer; and
   annealing any remaining reacted second metal layer to form the second silicide regions.

18. The method of claim 17, where either annealing step comprises a rapid thermal anneal, a furnace anneal, a spike anneal or a laser anneal.

19. A method for fabricating silicide regions using two silicide formation processes, comprising:
   forming first silicide regions in a polysilicon gate and active source/drain regions;
   forming sidewall spacers adjacent the polysilicon gate to partially cover at least part of the first silicide regions in the active source/drain regions; and then
   forming second silicide regions in the polysilicon gate and any exposed surface of the active source/drain regions not covered by the sidewall spacers by using the sidewall spacers to effectively separate the second silicide regions in the active source/drain regions further from a channel region than the first silicide regions, thereby reducing encroachment of the second silicide regions.

20. The method of claim 19, where the first suicide regions are formed from cobalt silicide and the second silicide regions are formed from nickel silicide.

* * * * *